United States Patent
Hsu et al.

(10) Patent No.: US 11,363,724 B1
(45) Date of Patent: Jun. 14, 2022

(54) FABRICATION METHOD OF FLEXIBLE ELECTRONIC PACKAGE DEVICE

(71) Applicant: Industrial Technology Research Institute, Hsinchu (TW)

(72) Inventors: Chien-Min Hsu, New Taipei (TW); Chih-Ming Shen, New Taipei (TW); Shih-Hsien Wu, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 17/126,033

(22) Filed: Dec. 18, 2020

(51) Int. Cl.
  *H05K 3/30* (2006.01)
  *H05K 1/18* (2006.01)
  *H01L 23/498* (2006.01)
  *H01L 23/00* (2006.01)

(52) U.S. Cl.
  CPC .............. *H05K 3/303* (2013.01); *H05K 1/189* (2013.01); *H01L 23/4985* (2013.01); *H01L 24/73* (2013.01); *H01L 2224/73204* (2013.01)

(58) Field of Classification Search
  CPC .... H05K 3/303; H05K 1/189; H01L 23/4985; H01L 24/73; H01L 2224/73204
  USPC ................. 29/841, 829, 825, 592.1
  See application file for complete search history.

(56) References Cited

U.S. PATENT DOCUMENTS

| | | | |
|---|---|---|---|
| 7,971,492 B2 * | 7/2011 | Wen | G01N 3/20 73/849 |
| 8,076,762 B2 | 12/2011 | Chandrasekaran et al. | |
| 9,557,862 B2 | 1/2017 | Ho et al. | |
| 9,778,688 B2 | 10/2017 | Tang et al. | |

FOREIGN PATENT DOCUMENTS

| | | |
|---|---|---|
| CN | 103558093 | 9/2015 |
| CN | 106031308 | 10/2016 |
| CN | 111816063 | 10/2020 |
| TW | 200944792 | 11/2009 |
| TW | M541182 | 5/2017 |
| TW | 202005006 | 1/2020 |
| WO | 2018081705 | 5/2018 |

OTHER PUBLICATIONS

"Office Action of Taiwan Counterpart Application", dated May 6, 2021, p. 1-p. 6.

* cited by examiner

Primary Examiner — Peter Dungba Vo
Assistant Examiner — Azm A Parvez
(74) Attorney, Agent, or Firm — JCIPRNET

(57) ABSTRACT

A fabrication method of a flexible electronic package device including the following steps is provided. A tolerable bending radius of the flexible electronic package device is obtained. A minimum surface curvature radius of a selected portion of an applied carrier is obtained. A relationship of the tolerable bending radius being smaller than the minimum surface curvature radius is ensured. The flexible electronic package device is disposed on the selected portion.

9 Claims, 8 Drawing Sheets

FABRICATION METHOD OF FLEXIBLE ELECTRONIC PACKAGE DEVICE

BACKGROUND

Technical Field

The disclosure relates to a fabrication method of an electronic device, and particularly relates to a fabrication method of a flexible electronic package device.

Description of Related Art

As electronic technology continues to evolve, the application of electronic devices in daily life has become increasingly widespread. Particularly, the technology of flexible package is receiving more and more attention. However, the use of flexible package technology faces the issue of poor yield and short service life resulting from the tendency for electronic components to be damaged or fall off easily.

SUMMARY

The disclosure provides a fabrication method of a flexible electronic package device, which helps to ensure the normal operation of the functions of the flexible electronic package device and prolong its service life.

A fabrication method of a flexible electronic package device according to the disclosure includes, but is not limited to, the following steps. A tolerable bending radius of a flexible electronic package device is obtained. A minimum surface curvature radius of a selected portion of an applied carrier is obtained. It is ensured that the tolerable bending radius is smaller than or equal to the minimum surface curvature radius. The flexible electronic package device is disposed on the selected portion.

Another fabrication method of a flexible electronic package device according to the disclosure includes, but is not limited to, the following steps. A minimum surface curvature radius of a selected portion of an applied carrier is obtained. A flexible electronic package device to be disposed on the selected portion is determined according to the minimum surface curvature radius, where the flexible electronic package device includes a plurality of members. A method of determining the flexible electronic package device includes the following. An initial bending radius is set, and a curving stress value of each of the members in the flexible electronic package device at the bending radius is calculated, where the bending radius is smaller than the minimum surface curvature radius. A tolerable maximum stress value of each of the members is determined. The flexible electronic package device is determined when the curving stress value of each of the members is less than the tolerable maximum stress value. Then, the flexible electronic package device is disposed on the selected portion.

Based on the above, the method according to the embodiments of the disclosure considers the curvature radius of the selected portion of the applied carrier and the tolerable bending radius of the flexible electronic package device to ensure whether the flexible electronic package device may be disposed on the applied carrier, thereby ensuring the service life of the flexible electronic package device on the applied carrier.

DESCRIPTION OF THE EMBODIMENTS

Figure 1:
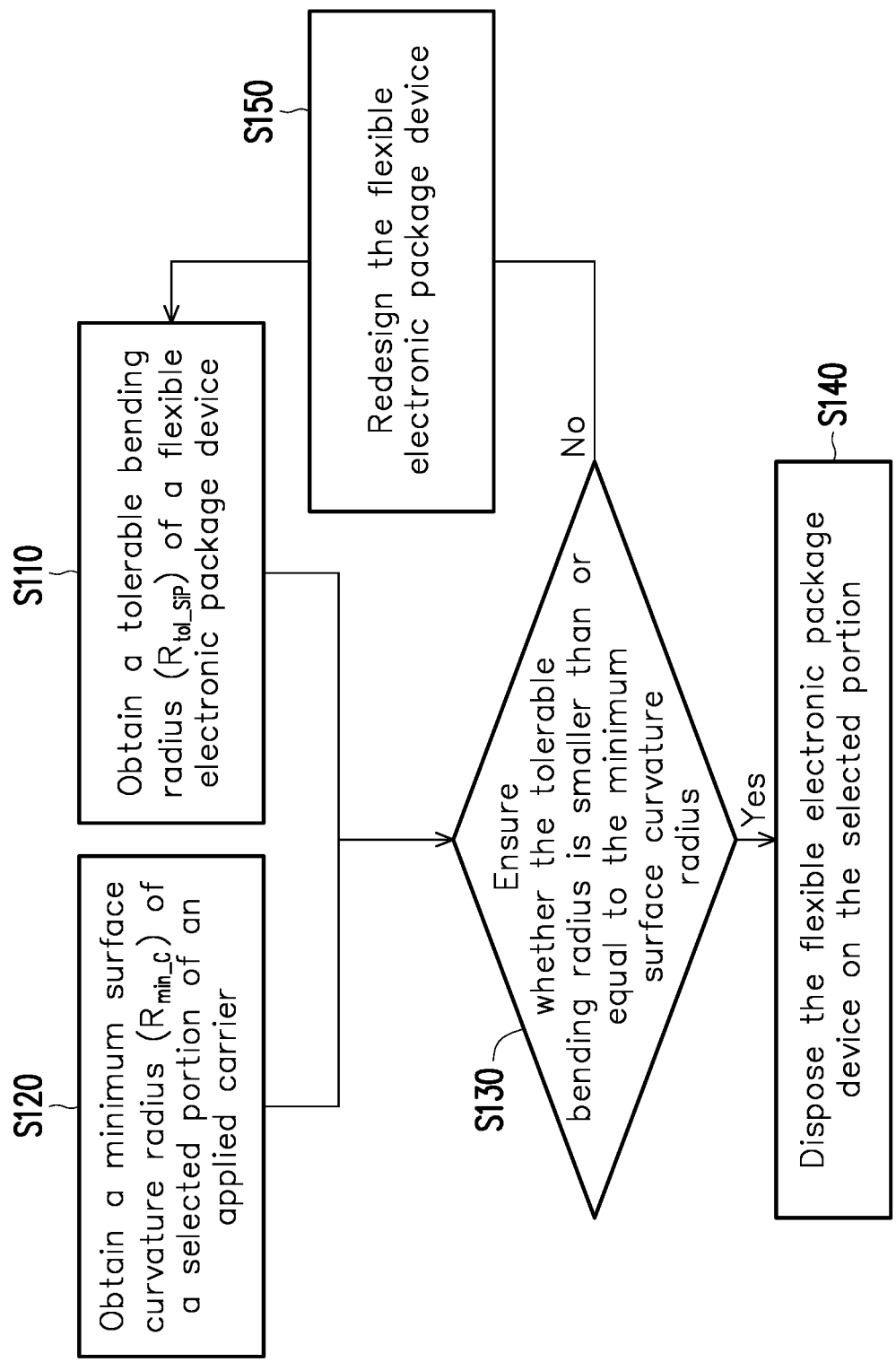
FIG. 1 shows a fabrication method of a flexible electronic package device according to an embodiment of the disclosure.

FIG. 1 shows a fabrication method of a flexible electronic package device according to an embodiment of the disclosure. As shown in FIG. 1, in step S110, a tolerable bending radius ($R_{tol\_Sip}$) of a flexible electronic package device is obtained. The flexible electronic package device has flexible characteristics, but when a stress caused by curving is too great, it is still possible for the flexible electronic package device to be damaged. Therefore, the tolerance of the flexible electronic package device to curving is a factor to be considered.

In the embodiment, the flexible electronic package device is intended to be disposed on an applied carrier for use. In other words, the applied carrier described in the document refers to an object on which the flexible electronic package device is intended to be disposed. For example, the applied carrier may be a wearable object or other three-dimensional objects. In order to ensure the normal operation of the flexible electronic package device after being disposed on the applied carrier, the characteristic of the applied carrier may be taken as a parameter to be considered when fabricating the flexible electronic package device. Therefore, in step S120, a minimum surface curvature radius ($R_{min\_C}$) of a selected portion of the applied carrier is obtained. In some embodiments, when the applied carrier itself is a three-dimensional object, step S120 may include scanning the selected portion of the applied carrier where the flexible electronic package device is intended to be disposed, so as to obtain surface curvature radius of individual surfaces in the selected portion, and select the smallest one from these surface curvature radius as the minimum surface curvature radius ($R_{min\_C}$) of the selected portion. In other embodiments, when the applied carrier itself is a fabric or a wearable object, the applied carrier may be positioned in a worn state first, and then the individual surfaces of the selected portion of the applied carrier in the worn state may be scanned, so as to select the smallest one from the surface curvature radius of the individual surfaces obtained by scanning as the minimum surface curvature radius ($R_{min\_C}$) of the selected portion. For example, when the applied carrier is clothing covering a human torso, such as T-shirts, shirts, sports tights, etc., the applied carrier may be worn on a human body-shaped mold first, and then the selected portion of the applied carrier may be scanned to obtain the minimum surface curvature radius ($R_{min\_C}$) of the selected portion.

Then, step S130 may be performed to ensure whether the tolerable bending radius ($R_{tol\_Sip}$) of the flexible electronic package device is smaller than the minimum surface curvature radius ($R_{min\_C}$) of the selected portion of the applied carrier. "The tolerable bending radius ($R_{tol\_Sip}$) of the flexible electronic package device is smaller than the minimum surface curvature radius ($R_{min\_C}$) of the selected portion of the applied carrier" means that the flexural stress received by the flexible electronic package device when being disposed on the surface of the selected portion may be smaller than the tolerance of the flexible electronic package device itself. In other words, the flexible electronic package device disposed on the selected portion of the applied carrier is less likely to be damaged due to the uneven surface of the selected portion. Therefore, after it is determined in step S130 that the tolerable bending radius ($R_{tol\_Sip}$) of the flexible electronic package device is smaller than the minimum surface curvature radius ($R_{min\_C}$) of the selected portion of the applied carrier, step S140 may be performed to dispose the flexible electronic package device on the selected portion. In this way, although the applied carrier provided with the flexible electronic package device is curved during use or the applied carrier itself has a curved surface, the flexible electronic package device is not easily damaged, thereby achieving higher manufacturing yield and better service life.

In addition, when the determination in step S130 is "No", that is, the tolerable bending radius ($R_{tol\_Sip}$) of the flexible electronic package device is larger than the minimum surface curvature radius ($R_{min\_C}$) of the selected portion of the applied carrier, it means that the surface curvature degree of the selected portion of the applied carrier may be equal to or greater than the tolerance of the flexible electronic package device. At this time, step S150 may be performed to redesign the flexible electronic package device. In some embodiments, a method of redesigning the flexible electronic package device includes the method shown in FIG. 2, so that the redesigned flexible electronic package device may satisfy the relationship that the tolerable bending radius ($R_{tol\_Sip}$) is smaller than or equal to the minimum surface curvature radius ($R_{min\_C}$) of the selected portion. The redesigned flexible electronic package device may be inspected through step S110 to step S130 of FIG. 1 until step S140 may be entered to dispose the flexible electronic package device on the selected portion. In this way, although the applied carrier provided with the flexible electronic package device is curved during use or the applied carrier itself has a curved surface, the flexible electronic package device is not easily damaged, thereby achieving higher manufacturing yield and better service life.

Figure 2:
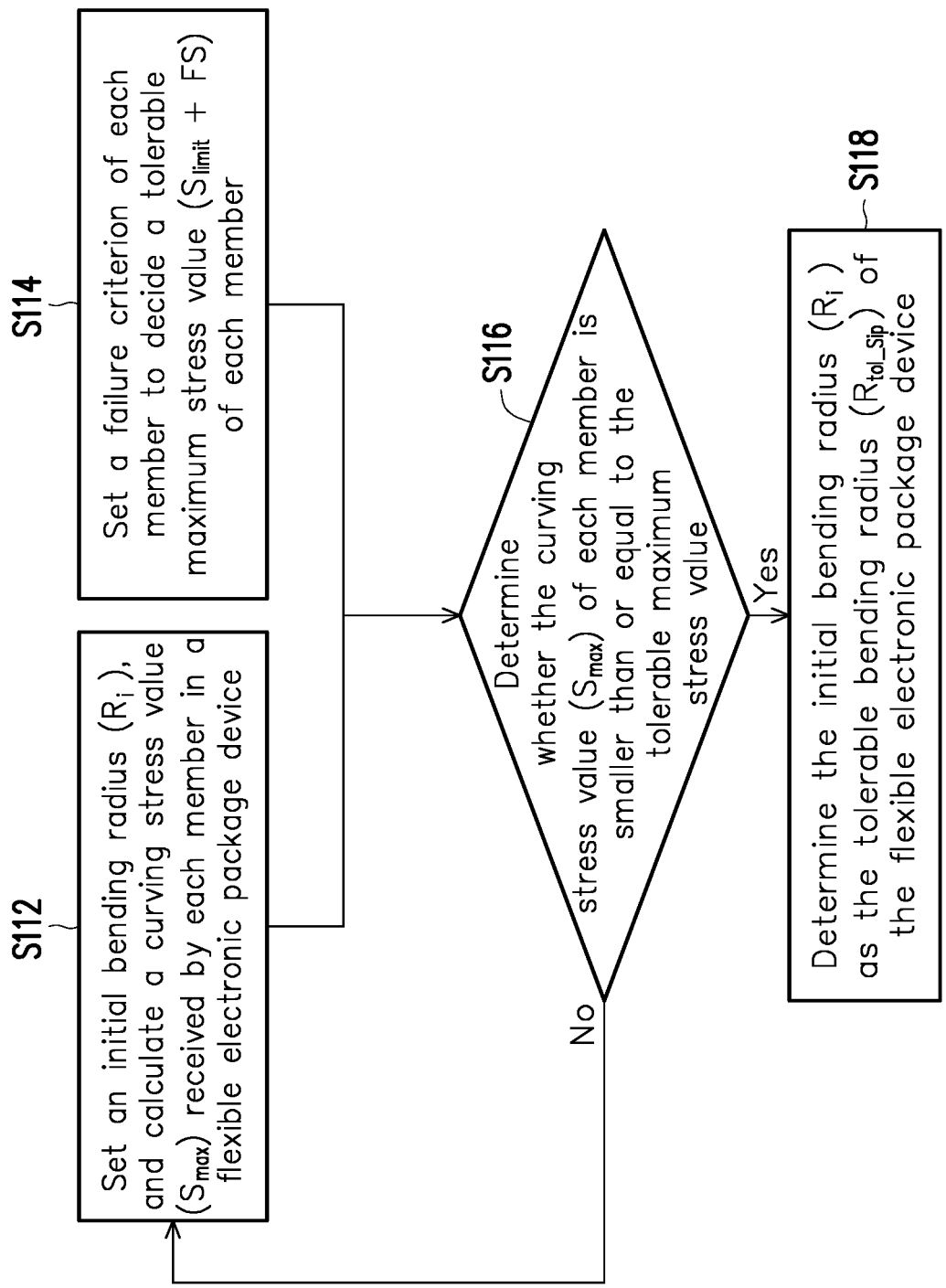
FIG. 2 schematically illustrates a method of obtaining a tolerable minimum bending radius of a flexible electronic package device according to some embodiments.

FIG. 2 schematically illustrates a method of obtaining a tolerable minimum bending radius of a flexible electronic package device according to some embodiments. Generally speaking, the flexible electronic package device may include a plurality of members, and the material characteristic of each member, the arrangement position, and the stacking relationship between the members affect the tolerance of the flexible electronic package device to flexural stress. Therefore, the method of FIG. 2 may be used to obtain the tolerable minimum bending radius ($R_{tol\_Sip}$) of the flexible electronic package device. Specifically, in step S112, an initial bending radius ($R_i$) may be set, and a curving stress value ($S_{max}$) of each member in the flexible electronic package device may be calculated. Also, in step S114, a failure criterion of each member is set, so as to determine a tolerable maximum stress value ($S_{limit}$+FS) of each member. Herein, $S_{limit}$ is, for example, a yield strength or ultimate strength of an individual member, and FS is, for example, a factor of safety. In some embodiments, the factor of safety may be defined as $S_{limit}$×safety percentage, where the safety percentage may be set greater than 0% and up to 100%. Taking the safety percentage set as 100% as an example, the tolerable maximum stress value of each member may be about $S_{limit}$+$S_{limit}$×100%, which is twice the yield strength of an individual member. Taking the safety percentage set as 50% as an example, the tolerable maximum stress value of each member may be about $S_{limit}$+$S_{limit}$×50%, which is 1.5 times the yield strength of an individual member.

In step S116, it may be determined whether the curving stress value ($S_{max}$) of each member is less than or equal to the tolerable maximum stress value. "The curving stress value ($S_{max}$) of each member at the initial bending radius ($R_i$) is less than or equal to the tolerable maximum stress value" means that the stress received by the member under the curving degree of the initial bending radius ($R_i$) has not yet reached its tolerance. At this time, the member is not easily damaged due to curving. Therefore, when all of the members of the flexible electronic package device satisfy the relationship that the curving stress value ($S_{max}$) at the initial bending radius ($R_i$) is less than or equal to the tolerable maximum stress value, that is, the determination in step S116 is "Yes", step S118 may be performed to determine to use the set initial bending radius ($R_i$) as the tolerable minimum bending radius ($R_{tol\_Sip}$) of the flexible electronic package device. The determined tolerable bending radius ($R_{tol\_Sip}$) may be applied to step S110 in FIG. 1. In step S130 of FIG. 1, if the determined tolerable minimum bending radius ($R_{tol\_Sip}$) of the flexible electronic package device is less than or equal to the minimum surface curvature radius ($R_{min\_C}$), the flexible electronic package device may be disposed on the selected portion of the applied carrier. In step S130 of FIG. 1, if the determined tolerable minimum bending radius ($R_{tol\_Sip}$) is greater than the minimum surface curvature radius ($R_{min\_C}$), it is necessary to change the configured design of the flexible electronic package device, and re-obtain the minimum surface curvature radius ($R_{min\_C}$) after updating the design according to the method of FIG. 2, and then proceed with the determination process of FIG. 1.

In addition, if a curving stress value $S_{max}$ of a member at the initial bending radius ($R_i$) is greater than the tolerable maximum stress value, that is, the determination in step S116 is "No", it means that the condition of the initial bending radius ($R_i$) may cause some members to receive stress greater than their tolerance, and the members are likely to be damaged due to curving. Therefore, when it is determined that a curving stress value ($S_{max}$) of a member at the initial bending radius ($R_i$) is greater than the tolerable maximum stress value, step S112 may be continued to reset another bending radius ($R_i'$). This another reset bending radius may be greater than the initial bending radius ($R_i$) set the previous time, so as to find out the conditions where the curving stress value ($S_{max}$) is less than the tolerable maximum stress value.

In some embodiments, the initial bending radius ($R_i$) of step S112 may be set according to the minimum surface curvature radius ($R_{min\_C}$) of the selected portion of the applied carrier obtained in step S120 of FIG. 1. For example, the portion of the applied carrier where the flexible electronic package device is intended to be disposed is selected in advance. At this time, step S120 of FIG. 1 may be performed to scan the selected portion of the applied carrier to obtain the minimum surface curvature radius ($R_{min\_C}$) of the selected portion. Afterwards, the initial bending radius ($R_i$) of step S112 may be set according to the minimum surface curvature radius ($R_{min\_C}$) of the selected portion of the applied carrier, so as to determine the flexible electronic package device that is suitable for being disposed on the selected portion of the carrier. Specifically, a method of determining the electronic package device that is suitable for being disposed on the selected portion of the carrier includes the following. The initial bending radius ($R_i$) is set according to step S112, so that the set initial bending radius ($R_i$) is smaller than the minimum surface curvature radius ($R_{min\_C}$) of the selected portion of the carrier surface, and the curving stress value of each member in the flexible electronic package device at the above-mentioned initial bending radius ($R_i$) is calculated. Next, as described in step S114, the tolerable maximum stress value of each member is determined, and the determination according to the step of step S116 is performed. If it is determined in step S116 of FIG. 2 that the individual curving stress values ($S_{max}$) of all the members are less than or equal to the individual tolerable maximum stress values, it is determined that the electronic package device is suitable for being disposed on the selected portion of the carrier. Since the initial bending radius ($R_i$) is already set to be smaller than the minimum surface curvature radius ($R_{min\_C}$) when the initial bending radius ($R_i$) is set, after the determination of step S116 is passed, step S140 may be entered. Therefore, the flexible electronic package device may be disposed on the selected portion of the applied carrier.

Figure 3:
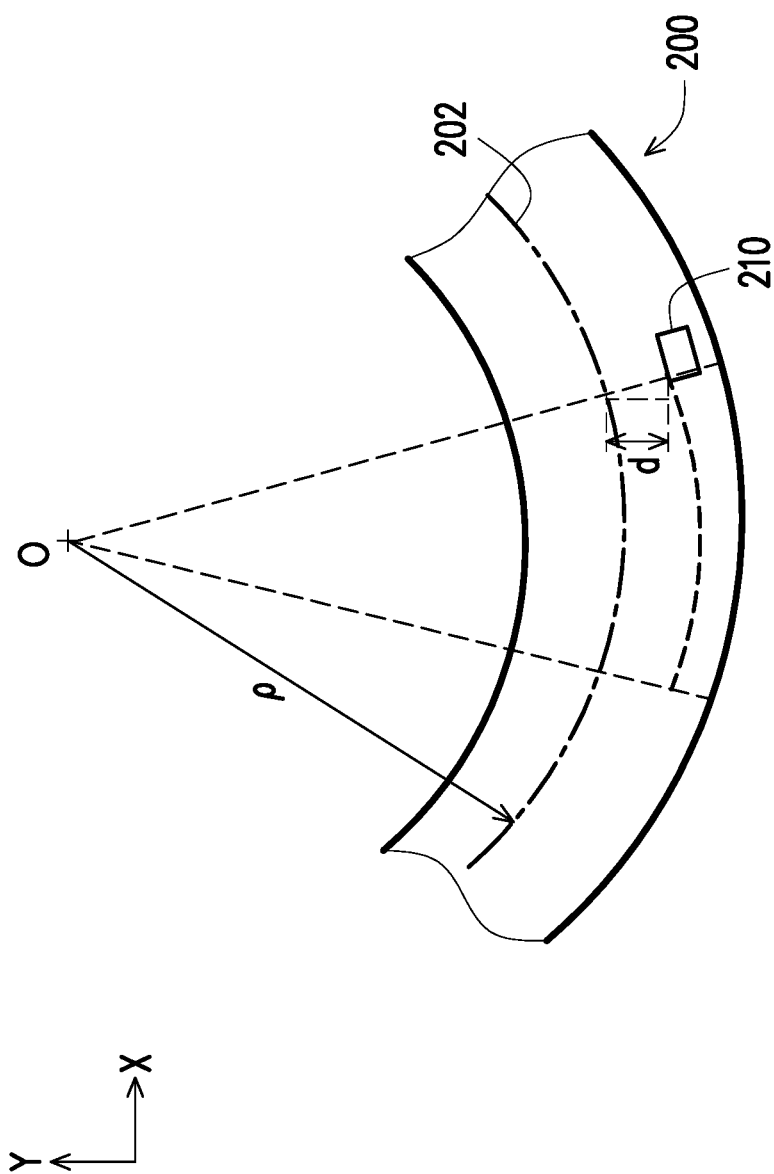
FIG. 3 schematically illustrates a method of obtaining a curving stress value of each member.

FIG. 3 schematically illustrates a method of obtaining the curving stress value of each member. In other words, FIG. 3 illustrates the specific method of step S112, but is not limited thereto. In FIG. 3, a flexible electronic package device 200 is, for example, in a curved state and has a neutral surface 202, where the neutral surface 202 refers to a surface formed by points at which the received curving stress in a curved state is zero. In addition, in the embodiment, a curvature radius p is defined as the distance from a curvature center O to the neutral surface 202. A member 210 and the neutral surface 202 in the flexible electronic package device 200 are separated by a distance d in the Y direction, and the neutral surface 202 is located between the curvature center O and the member 210. Thus, a curving stress value $\sigma_x$ received by the member 210 in the X direction may be calculated by the formula: $\sigma_x = -E \times d/\rho$, where E is the Young's coefficient of the member 210. Accordingly, the curving stress received by the member 210 is proportional to the distance d from the neutral surface 202 and the Young's coefficient E, and inversely proportional to the curvature radius ρ.

Figure 4:
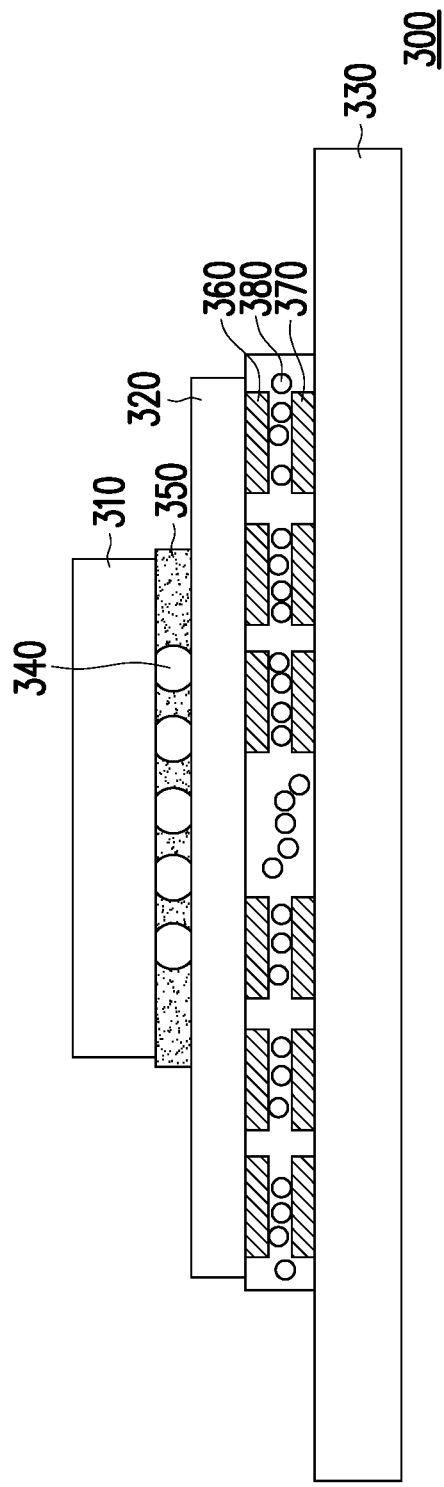
FIG. 4 and FIG. 5 are schematic diagrams of flexible electronic package devices according to some embodiments of the disclosure.
Figure 5:
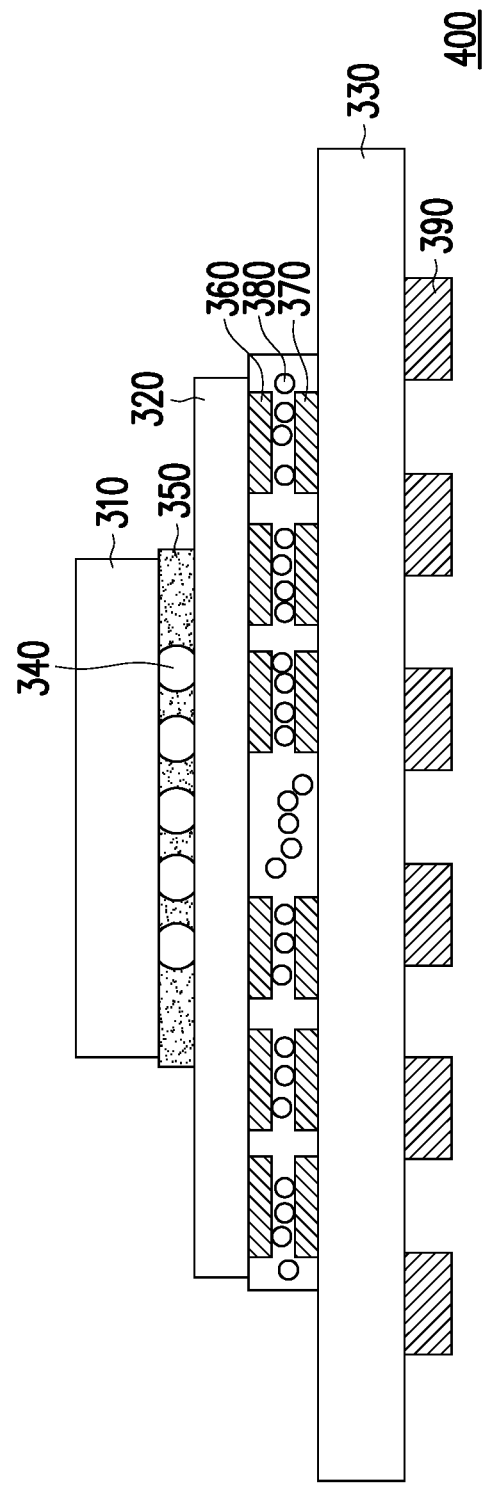

FIG. 4 and FIG. 5 are schematic diagrams of flexible electronic package devices according to some embodiments of the disclosure. In FIG. 4, a flexible electronic package device 300 may include a plurality of members 310 to 380. Specifically, the member 310 is, for example, an electronic component, which includes, for example, an integrated circuit chip, a passive component, a sensing component, and the like. The member 320 is, for example, a first flexible carrier board, which is, for example, a substrate that has flexibility and provides sufficient support to stably carry the electronic component 310. The member 330 is, for example, a second flexible carrier board, which is used to carry the first flexible carrier board, and the size of the second flexible carrier board may be larger than that of the first flexible carrier board. The member 310 may be bonded onto the member 320, and the member 320 may be bonded onto the member 330 to form a stacked structure in which the first flexible carrier board is located between the second flexible carrier board and the electronic component. In addition, the member 310 may be electrically connected to the member 320, and the member 320 may be electrically connected to the member 330. That is to say, there may be electrical connection between the electronic component, the first flexible carrier board, and the second flexible carrier board.

In addition, the member 340 may be a conductive bonding member, which is used to bond the member 310 onto the member 320. In some embodiments, the member 340 may be a conductive bump, a solder, a conductive ball, or the like. The member 350 may be disposed between the member 310 and the member 320 and used to fill the gap between the members 340. In some embodiments, the member 350 is a filler, for example, including materials such as an epoxy resin, a polyimide, and the like. The member 340 may electrically connect the member 310 to the member 320. In some embodiments, the member 320 has, for example, conductive through-holes, and the member 360 is, for example, a conductive pad disposed on the surface of the member 320. The member 340 may be electrically connected to the member 360 on the opposite side via the conductive through-holes in the member 320. The member 370 is, for example, a conductive pad disposed on the member 330, and the member 370 and the member 360 face each other. The member 380 is, for example, a bonding member having conductive particles, and is disposed between the member 360 and the member 370, so as to electrically connect the structure of the member 360 to the member 370. In this way, the member 310 may be electrically connected to the conductive circuit in the member 330 through the member 340, the conductive through-holes of the member 320, the member 360, the member 380, and the member 370. The member 380 may be an anisotropic conductive adhesive, but is not limited thereto.

In FIG. 5, a flexible electronic package device 400 includes all the members 310 to 380 of the flexible electronic package device 300 of FIG. 4, and further includes a member 390. The member 390 is, for example, a sensing electrode. The member 390 (sensing electrode) is disposed on the member 330 (the second flexible carrier board), and is located on the side of the member 330 (the second flexible carrier board) away from the member 320 (the first flexible carrier board). The material of the sensing electrode includes a biocompatible material. When the flexible electronic package device 400 is disposed on the surface of the applied carrier, the member 390 may face the user, and be disposed in contact with the user. For example, when the applied carrier is a wearable object, the method of disposing the flexible electronic package device 400 on the wearable object is to configure the member 390 to be located on the side close to the wearer.

The flexible electronic package device 300 of FIG. 4 may be designed using the methods of FIG. 1 and FIG. 2. For the flexible electronic package device 300 of FIG. 4, the curving stress values ($S_{max}$) at the set initial bending radius ($R_i$) may be respectively obtained for the members 310 to 380 according to step S112 of FIG. 2, and the tolerable bending radius ($R_{tol\_Sip}$) of the flexible electronic package device may be determined as described in step S116 and step S118. Afterwards, it may be ensured whether the flexible electronic package device 300 is suitable for being disposed on the selected portion of the applied carrier according to the method of FIG. 1. Of course, the flexible electronic package device 400 of FIG. 5 may also be designed using the above-mentioned method.

Figure 6:
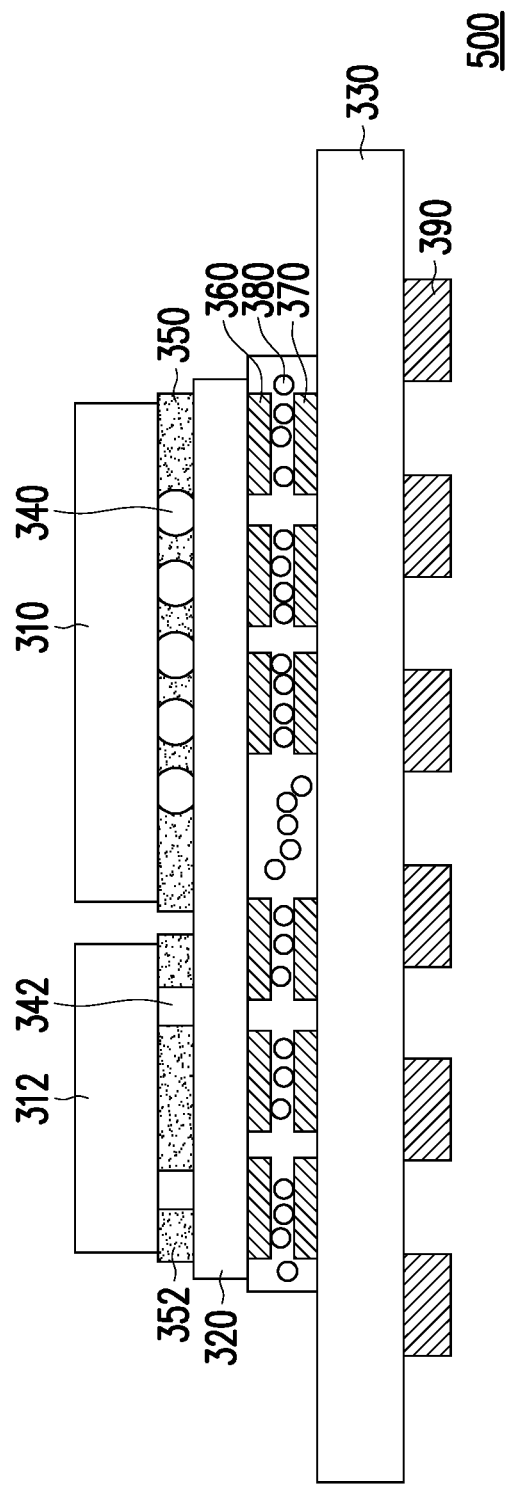
FIG. 6 is a schematic diagram of a flexible electronic package device according to some embodiments of the disclosure.

FIG. 6 is a schematic diagram of a flexible electronic package device according to some embodiments of the disclosure. In FIG. 6, a flexible electronic package device 500 includes all the members 310 to 390 of the above-mentioned flexible electronic package device 400, and further includes a member 312, a member 342, and a member 352. The member 312 is an electronic component, for example, including an integrated circuit, a passive component, a sensing component, and the like. The member 342 may be a conductive bonding member which is used to bond the member 312 onto the member 320 and electrically connect the member 342 to the member 320. The member 352 may be disposed between the member 312 and the member 320 and used to fill the gap between the members 342. In some embodiments, the member 310 and the member 312 are both electronic components, but may be used to perform different functional operations. The member 342 and the member 340 are both conductive bonding members, and may have the same or different structures and/or materials. The member 352 and the member 350 are both fillers, but may have the same or different materials. The flexible electronic package device 500 of FIG. 6 may be designed and fabricated using the methods of FIG. 1 and FIG. 2, so that the flexible electronic package device 500 may have an ideal service life after being disposed on the applied carrier.

Figure 7:
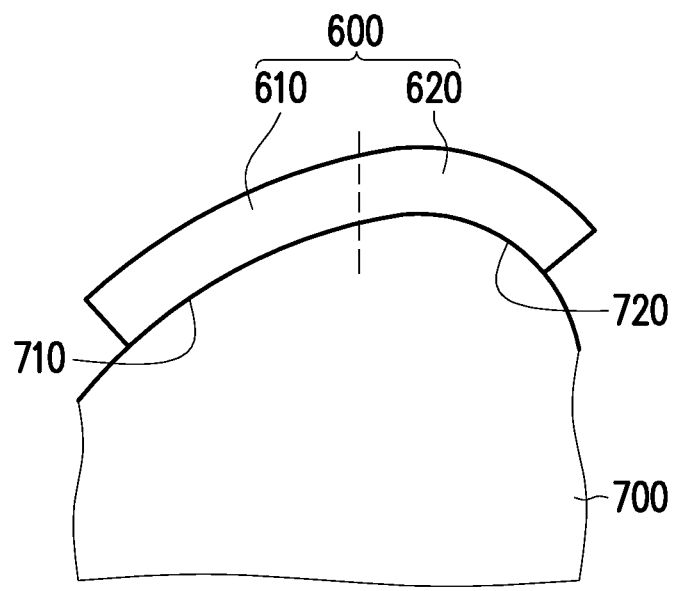
FIG. 7 is a schematic diagram of a flexible electronic package device disposed on an applied carrier according to an embodiment of the disclosure.

FIG. 7 is a schematic diagram of a flexible electronic package device disposed on an applied carrier according to an embodiment of the disclosure. In FIG. 7, a flexible electronic package device 600 is, for example, to be disposed on an applied carrier 700. Specifically, in actual use, the applied carrier 700 has a selected portion 710 and a selected portion 720 with different surface curvatures. FIG. 7 schematically illustrates that the minimum surface curvature of the selected portion 710 is greater than the minimum surface curvature of the selected portion 720, and the flexible electronic package device 600 is intended to be disposed on the applied carrier 700 across the selected portion 710 and the selected portion 720. In other words, a first portion 610 of the flexible electronic package device 600 is, for example, to be disposed on the selected portion 710, and a second portion 620 of the flexible electronic package device 600 is, for example, to be disposed on the selected portion 720.

When fabricating the flexible electronic package device 600, whether the first portion 610 of the flexible electronic package device 600 is suitable for being disposed on the selected portion 710 is determined first according to the method of FIG. 1, and whether the second portion 620 of the flexible electronic package device 600 is suitable for being disposed on the selected portion 720 is determined according to the method of FIG. 1 again. After the determination of step S130 of FIG. 1 for both the first portion 610 and the second portion 620 is "Yes", the flexible electronic package device 600 may be disposed on the applied carrier 700. That is to say, different portions of the flexible electronic package device 600 may be respectively designed according to the surface shapes of the selected portions on which they are intended to be disposed.

For example, the tolerable bending radius ($R_{tol\_Sip}$) of the first portion 610 of the flexible electronic package device 600 may be obtained according to step S110 of FIG. 1 and the method of FIG. 2. In addition, according to step S120 of FIG. 1, the minimum surface curvature radius ($R_{min\_C}$) of the selected portion 710 is obtained. Next, a determination is performed based on the tolerable bending radius ($R_{tol\_Sip}$) of the first portion 610 and the minimum surface curvature radius ($R_{min\_C}$) of the selected portion 710 according to step S130 of FIG. 1. If the result of the determination is that the tolerable bending radius ($R_{tol\_Sip}$) is greater than the minimum surface curvature radius ($R_{min\_C}$), it is required to change the design of the first portion 610 of the electronic package device 600. For example, it is required to change the structure, material, or both the structure and material of the first portion 610, and after the change, perform the above-mentioned step again until the result of the determination of step S130 is "Yes".

In addition, the second portion 620 of the flexible electronic package device 600 and the selected portion 720 are also analyzed, determined, and even redesigned according to the above-mentioned step until the tolerable bending radius ($R_{tol\_Sip}$) of the second portion 620 is smaller than or equal to the minimum surface curvature radius ($R_{min\_C}$) of the selected portion 720 (the determination of step S130 is passed and step S140 may be entered). After the determination of step 130 of FIG. 1 for both the first portion 610 and the second portion 620 is "Yes", the flexible electronic package device 600 may be disposed on the applied carrier 700, so that the first portion 610 is correspondingly disposed on the selected portion 710 and the second portion 620 is correspondingly disposed on the selected portion 720. In this way, although the selected portion 710 and the selected portion 720 of the applied carrier 700 have non-flat surfaces in a use and/or wear state, the flexible electronic package device 600 is not easily damaged due to curving stress. Therefore, the flexible electronic package device 600 may have an ideal service life.

Figure 8:
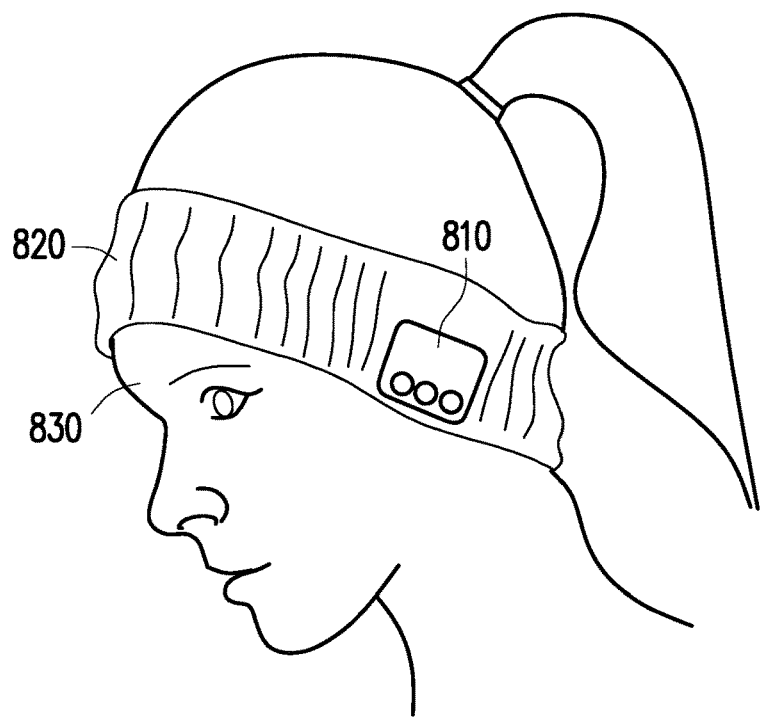
FIG. 8 to FIG. 11 schematically illustrate implementations of flexible electronic package devices disposed on applied carriers.

FIG. 8 to FIG. 11 schematically illustrate implementations of flexible electronic package devices disposed on applied carriers. In FIG. 8, a flexible electronic package device 810 is, for example, disposed on an applied carrier 820, where the applied carrier 820 is, for example, a headband. When the applied carrier 820 is worn, the applied carrier 820 curves in accordance with the curve of the wearer's head, for example. Therefore, the minimum surface curvature radius of the portion where the flexible electronic package device 810 is disposed substantially corresponds to the curve of the user's head, for example. The flexible electronic package device 810 may be fabricated according to the methods of FIG. 1 and FIG. 2, and when performing step S120 of FIG. 1, the applied carrier 820 may be sleeved on a human head-shaped mold 830 first, and then the surface curvature radius of the selected portion may be scanned to obtain the minimum surface curvature radius ($R_{min\_C}$).

Figure 9:
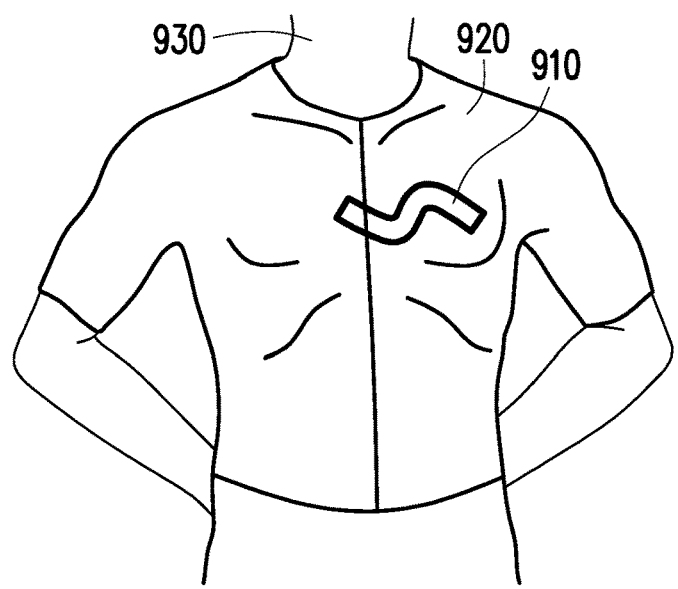

In FIG. 9, a flexible electronic package device 910 is, for example, disposed on an applied carrier 920 The applied carrier 920 is, for example, upper torso clothing, and the flexible electronic package device 910 is, for example, to be disposed on the chest portion (selected portion) of the clothing. When the applied carrier 920 is worn, the applied carrier 920 curves in accordance with the curve of the upper torso of the wearer, for example. Therefore, the minimum surface curvature radius of the selected portion where the flexible electronic package device 910 is to be disposed substantially corresponds to the curve of the user's chest, for example. In some embodiments, the flexible electronic package device 910 may be fabricated according to the methods of FIG. 1 and FIG. 2, where a human body-shape mold 930 may be used to stretch the applied carrier 920 into a worn state, and then the surface of the selected portion (chest portion) where the flexible electronic package device 910 is to be disposed may be scanned to perform step S120 of FIG. 1 to obtain the minimum surface curvature radius ($R_{min\_C}$).

Figure 10:
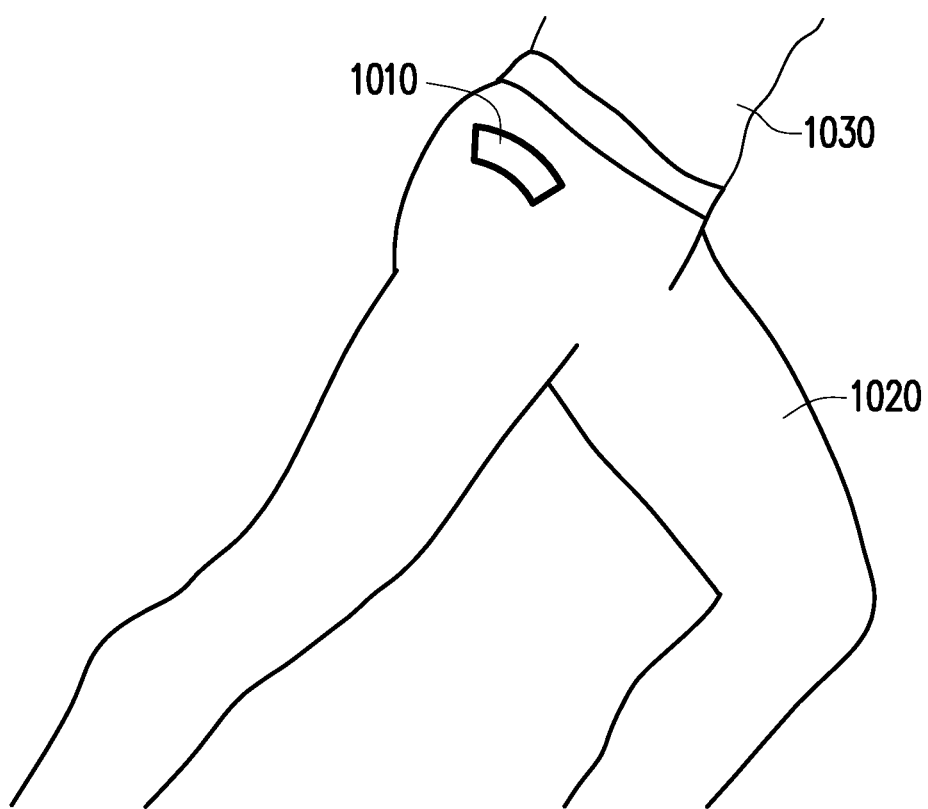

In FIG. 10, a flexible electronic package device 1010 is, for example, disposed on an applied carrier 1020, where the applied carrier 1020 is, for example, sports pants, and the flexible electronic package device 1010 is, for example, to be disposed on the hip portion of the sports pants. When the applied carrier 1020 is worn, the applied carrier 1020 curves in accordance with the curve of the hips and thighs of the wearer, for example. Therefore, the minimum surface curvature radius of the selected portion where the flexible electronic package device 1010 is to be disposed substantially corresponds to the curve of the user's hip portion, for example. In some embodiments, the flexible electronic package device 1010 may be fabricated according to the methods of FIG. 1 and FIG. 2, where a human body-shaped mold 1030 may be used to stretch the applied carrier 1020 into a worn state, and then the surface of the selected portion where the flexible electronic package device 1010 is to be disposed may be scanned to perform step S120 of FIG. 1 to obtain the minimum surface curvature radius ($R_{min\_C}$).

Figure 11:
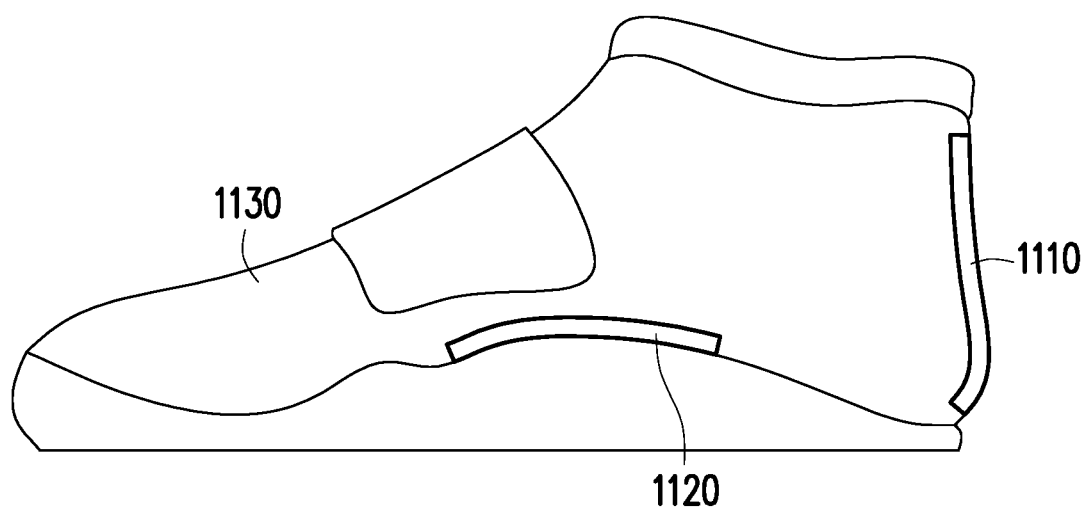

In FIG. 11, a flexible electronic package device 1110 and a flexible electronic package device 1120 are, for example, disposed on an applied carrier 1130, where the applied carrier 1130 is, for example, a shoe, the flexible electronic package device 1110 is, for example, to be disposed on the heel portion of the shoe, and the flexible electronic packaging device 1120 is, for example, to be disposed on the arch portion of the shoe. The applied carrier 1130 itself is a three-dimensional object, which has curved surfaces on both the heel portion and the arch portion. Therefore, the flexible electronic package device 1110 may be designed corresponding to the curved surface of the heel portion, and the flexible electronic package device 1120 may be designed corresponding to the curved surface of the arch portion. In other words, when the method of FIG. 1 is performed, the heel portion and the arch portion of the shoe may be scanned to obtain the corresponding minimum surface curvature radius ($R_{min\_C}$).

In summary of the above, the fabrication method of the flexible electronic package device according to the embodiments of the disclosure determines whether a flexible electronic package device is suitable for being disposed on a selected portion of an applied carrier according to the characteristics of the flexible electronic package device and the surface state of the applied carrier, so that the flexible electronic package device is not easily damaged due to a curved state of the applied carrier in use and thereby has an ideal service life.

What is claimed is:

1. A fabrication method of a flexible electronic package device, comprising:
   obtaining a minimum surface curvature radius of a selected portion of an applied carrier;
   determining a flexible electronic package device to be disposed on the selected portion according to the minimum surface curvature radius, wherein the flexible electronic package device comprises a plurality of members, and a method of determining the flexible electronic package device comprises:
   setting an initial bending radius, and calculating a curving stress value of each of the members in the flexible electronic package device at the initial bending radius, wherein the initial bending radius is smaller than the minimum surface curvature radius;
   determining a tolerable maximum stress value of each of the members; and
   determining as the flexible electronic package device disposed on the selected portion when the curving stress value of each of the members is smaller than or equal to the tolerable maximum stress value; and
   disposing the flexible electronic package device on the selected portion.

2. The fabrication method of the flexible electronic package device according to claim 1, wherein the applied carrier is a three-dimensional object.

3. The fabrication method of the flexible electronic package device according to claim 1, wherein the members comprise a first flexible carrier board and an electronic component bonded to the first flexible carrier board.

4. The fabrication method of the flexible electronic package device according to claim 3, wherein the members further comprise a second flexible carrier board, the first flexible carrier board is bonded onto the second flexible carrier board, and a size of the second flexible carrier board is larger than a size of the first flexible carrier board.

5. The fabrication method of the flexible electronic package device according to claim 4, wherein the members further comprise a sensing electrode, the sensing electrode is disposed on the second flexible carrier board, and a material of the sensing electrode comprises a biocompatible material.

6. The fabrication method of the flexible electronic package device according to claim 4, wherein the sensing electrode is located on an outer side of the second flexible carrier board away from the first flexible carrier board.

7. The fabrication method of the flexible electronic package device according to claim 1, wherein the applied carrier comprises a wearable object.

8. The fabrication method of the flexible electronic package device according to claim 7, wherein the wearable object comprises a headband, clothes, pants, or a shoe.

9. The fabrication method of the flexible electronic package device according to claim 7, wherein a method of obtaining the minimum surface curvature radius of the selected portion of the applied carrier comprises scanning the selected portion of the applied carrier in a worn state to obtain surface curvature radius of individual surfaces in the selected portion, and selecting a smallest one from the surface curvature radius as the minimum surface curvature.

* * * * *